United States Patent
Hendrix et al.

(10) Patent No.: US 7,974,094 B2
(45) Date of Patent: Jul. 5, 2011

(54) OUTSIDE PLANT TELECOMMUNICATIONS CABINET DIRECT AIR COOLING SYSTEM

(75) Inventors: Mark Hendrix, Richardson, TX (US); Alan Skrepcinski, Plano, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 463 days.

(21) Appl. No.: 12/056,882

(22) Filed: Mar. 27, 2008

(65) Prior Publication Data

US 2008/0239668 A1 Oct. 2, 2008

Related U.S. Application Data

(60) Provisional application No. 60/907,249, filed on Mar. 27, 2007.

(51) Int. Cl.
H05K 7/20 (2006.01)
(52) U.S. Cl. ............... 361/695; 361/679.5; 361/679.51; 361/692; 361/694; 62/259.2; 454/184
(58) Field of Classification Search ............ 361/679.48, 361/679.49, 679.5, 690, 692, 694, 695, 697
See application file for complete search history.

(56) References Cited

U.S. PATENT DOCUMENTS

| | | | |
|---|---|---|---|
| 5,570,740 A | 11/1996 | Flores et al. | |
| 5,603,376 A | 2/1997 | Hendrix | |
| 5,832,988 A | 11/1998 | Mistry et al. | |
| 5,886,296 A * | 3/1999 | Ghorbani et al. | 174/50 |
| 6,119,768 A | 9/2000 | Dreier et al. | |
| 6,164,369 A | 12/2000 | Stoller | |
| 6,317,320 B1 | 11/2001 | Cosley et al. | |
| 6,400,045 B1 * | 6/2002 | Hosokawa et al. | 307/117 |
| 6,459,579 B1 * | 10/2002 | Farmer et al. | 361/695 |
| 6,494,252 B1 | 12/2002 | Takala et al. | |
| 6,749,498 B2 | 6/2004 | Pfister | |
| 6,767,379 B2 * | 7/2004 | Jones | 55/385.6 |
| 6,776,706 B2 * | 8/2004 | Kipka et al. | 454/184 |
| 2004/0217072 A1 * | 11/2004 | Bash et al. | 211/26 |
| 2005/0153649 A1 * | 7/2005 | Bettridge et al. | 454/188 |
| 2007/0207721 A1 * | 9/2007 | Chang | 454/184 |
| 2008/0188173 A1 * | 8/2008 | Chen et al. | 454/239 |
| 2008/0212286 A1 * | 9/2008 | Komatsu | 361/714 |
| 2008/0316038 A1 * | 12/2008 | Palaszewski | 340/584 |
| 2009/0097202 A1 * | 4/2009 | Gipson | 361/695 |

OTHER PUBLICATIONS

"Gore® Cooling Filters for Outdoor Electronic Enclosures," 30 page presentation by W.L. Gore & Associates, pp. 7 and 17-19.

* cited by examiner

Primary Examiner — Jayprakash N Gandhi
Assistant Examiner — Courtney Smith
(74) Attorney, Agent, or Firm — Muncy, Geissler, Olds & Lowe PLLC

(57) ABSTRACT

An outdoor equipment cabinet includes a housing with an equipment compartment therein. An intake air vent and an exit air vent are formed in the housing. A fan is mounted within the housing for pulling air into the intake air vent, moving an air stream through the equipment compartment, and pushing air out of the exit air vent. A membrane is disposed adjacent the intake air vent. The membrane allows air to pass therethrough, but resists the passage of water and contaminants therethrough. In some embodiments, a baffling plate is disposed to direct the air stream within the equipment compartment, and/or the fan speed is controlled by a temperature sensor, and/or a clogging of the membrane is monitored and reported, and/or the intake air vent is located in a first door and the exit air vent is located in a second door of the cabinet.

20 Claims, 4 Drawing Sheets

OUTSIDE PLANT TELECOMMUNICATIONS CABINET DIRECT AIR COOLING SYSTEM

This application claims the benefit of U.S. Provisional Application No. 60/907,249, filed Mar. 27, 2007, the entire contents of which are herein incorporated by reference.

BACKGROUND OF THE INVENTION

1. Field of the Invention

The present invention relates to a cabinet. More particularly, the present invention relates to an outdoor cabinet for housing communications equipment, which includes a thermal regulating system to maintain an internal temperature of the cabinet within prescribed limits.

2. Description of the Related Art

There are many types of optical and electronic equipment that must be located in an outdoor environment. For example, telecommunication equipment, networking equipment, and cable television equipment (generally referred to as "communication equipment") are often housed in an enclosure or cabinet located outdoors. In the communications industry, such equipment is often referred to as "outside plant equipment". Outside plant equipment can include such items as amplifiers, splitters, digital subscriber line access multiplexers (DSLAMs), surge protectors, backup batteries, etc.

It is essential that such equipment be operated within a prescribed temperature range and be protected from outside environment contaminates (e.g., water, dust, dirt, sand, insects, rodents). To this end, outdoor cabinets have been developed to house such communication equipment in a highly weather-tight and sealed manner.

Such equipment is known to generate a great deal of heat, especially when a piece of equipment includes a laser, as is the case with many fiber optic devices. This heat must be dissipated to ensure proper operation of the equipment and to prolong the life of the equipment. If the equipment is tightly sealed, a heat dissipating system needs to be employed.

Further, in many environments the cabinets, housing such equipment, are subjected to radiant heat from direct sunlight and light reflected from ground surfaces or adjacent buildings. Radiant heat sources can also greatly increase the interior temperature of the cabinet, which further exacerbates heat problems related to equipment operation.

There are air conditioning systems available in the prior art that may be used in conjunction with outside plant equipment cabinets to aid in maintaining a constant temperature environment for the internal communications equipment. However, an air conditioning system may not be cost effective for all applications. The initial cost of an air conditioning system is high. Further, an air conditioning system consumes a lot of power, takes up space within the cabinet, produces noise and requires periodic maintenance and charging.

An alternative approach has been suggested in several prior U.S. Patents, wherein a heat exchanger is employed to exchange heat between the "internal air" of the cabinet and the "external air" of the environment. The heat exchanger maintains a physical separation between the internal and external air flows so as to prevent contamination of the equipment within the cabinet. U.S. Pat. Nos. 5,570,740; 5,603,376; 5,832,988; 6,119,768, 6,164,369; 6,317,320, 6,494,252 and 6,749,498, all of which are herein incorporated by reference, disclose outdoor equipment cabinets with heat exchangers for cooling internal communication equipment.

SUMMARY OF THE INVENTION

The Applicants have appreciated one or more drawbacks associated with the designs of the prior art.

With the cabinets of the prior art, air conditioning units and heat exchanger units are bulky, add weight to the enclosure, and consume space within the enclosure. In other words, the outer dimensions of the enclosure visible to the customer must be enlarged to accommodate the AC unit or heat exchanger.

The Applicants have appreciated a need for an enclosure which can cool the interior of the enclosure without requiring an AC unit or heat exchanger. To this end, the Applicants have appreciated a need for a direct air cooling system for an enclosure which provides protection against the infiltration of water and other contaminants (e.g., pollen, dust, weeds, grass clippings, seeds, crawling insects).

The Applicants have also appreciated that the radiant heating of the cabinet could be greatly improved by a system to cool one or more of the outer walls of the cabinet.

The Applicants have also appreciated a cabinet having an internal baffling system to redirect cooling air to the internal equipment best served by a cooling air flow and/or to quiet a fan noise discernable at an exit vent via the serpentine path of the redirected air flow.

The Applicants have also appreciated a need in the art for a cabinet which improves on one or more of the following attributes: (A) minimization of acoustic noise from active components within the cabinet (such as fans); (B) a more compact overall size and increased density of electronic equipment within the housing; (C) a more streamlined outer housing shell; (D) a better directing of air flow to optimize the cooling effects within the cabinet; (E) a heating system for maintaining the interior of the enclosure above a prescribed temperature; (F) a fan redundancy to ensure performance in the case of a fan failure; (G) a variable speed fan system to prolong the lifespan of a filtering membrane; and/or (H) a monitoring system for reporting a potentially clogged membrane to a remote location.

The Applicants have also appreciated a need for a cabinet which is simple in design, rugged, more flexible as to end uses, easy to manufacture and/or less expensive to manufacture.

It is an object of the present invention to address one or more of the drawbacks of the prior art outdoor equipment cabinets and/or Applicants' appreciated needs in the art.

These and other objects are accomplished by an outdoor equipment cabinet including a housing with an equipment compartment therein. An intake air vent and an exit air vent are formed in the housing. A fan is mounted within the housing for pulling air into the intake air vent, moving an air stream through the equipment compartment, and pushing air out of the exit air vent. A membrane is disposed adjacent the intake air vent. The membrane allows air to pass therethrough, but resists the passage of water and contaminants therethrough. In some embodiments, a baffling plate is disposed to direct the air stream within the equipment compartment, and/or the fan speed is controlled by a temperature sensor, and/or a clogging of the membrane is monitored and reported, and/or the intake air vent is located in a first door and the exit air vent is located in a second door of the cabinet.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF THE INVENTION

Figure 1:
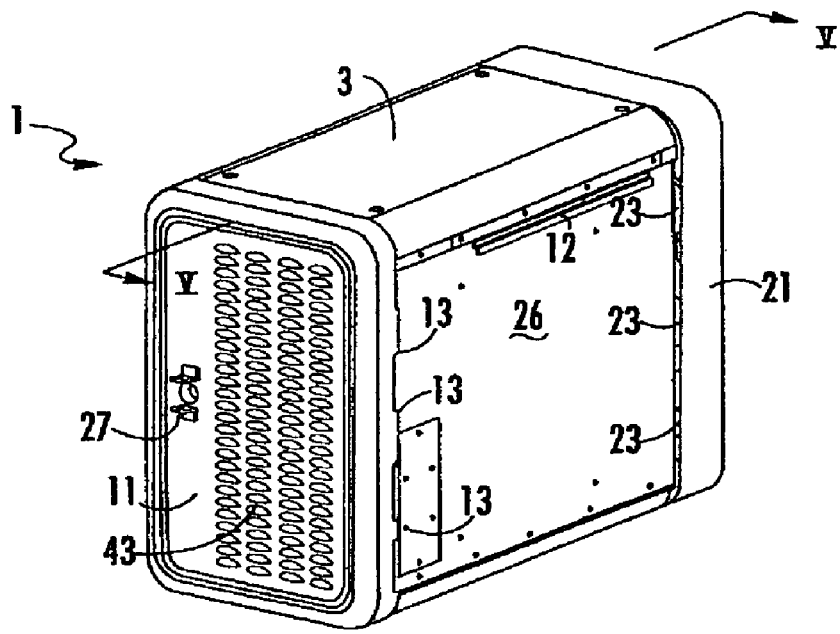
FIG. 1 is a front perspective view of an outdoor equipment cabinet in a closed state, in accordance with the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 2:
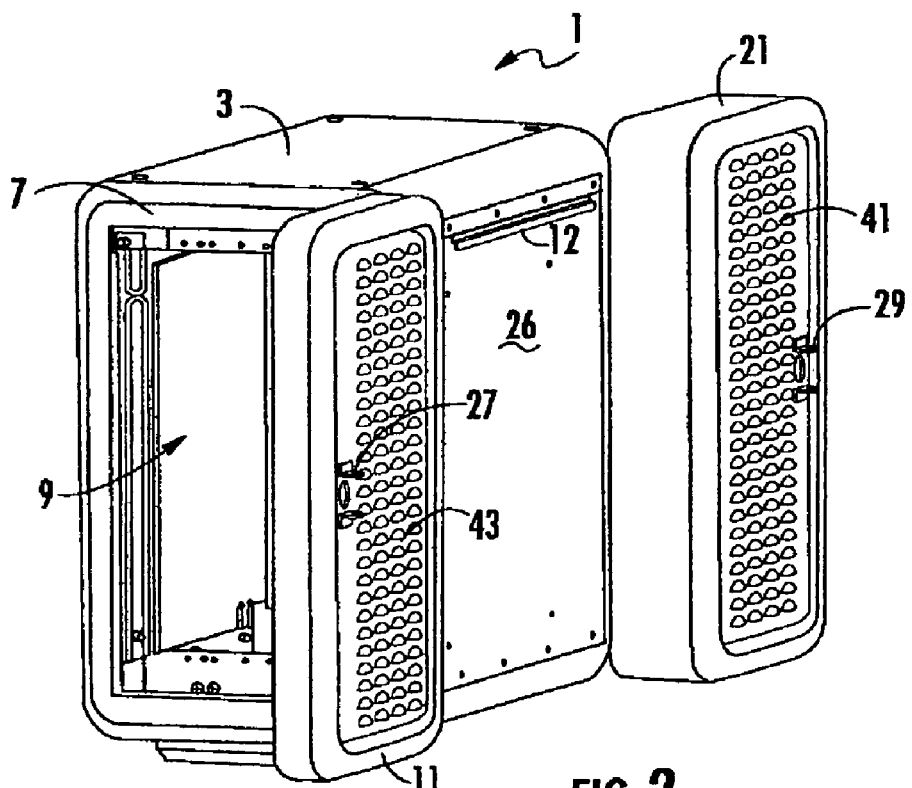
FIG. 2 is a front perspective view of the outdoor equipment cabinet of FIG. 1 with a front door and a rear door open.
Figure 3:
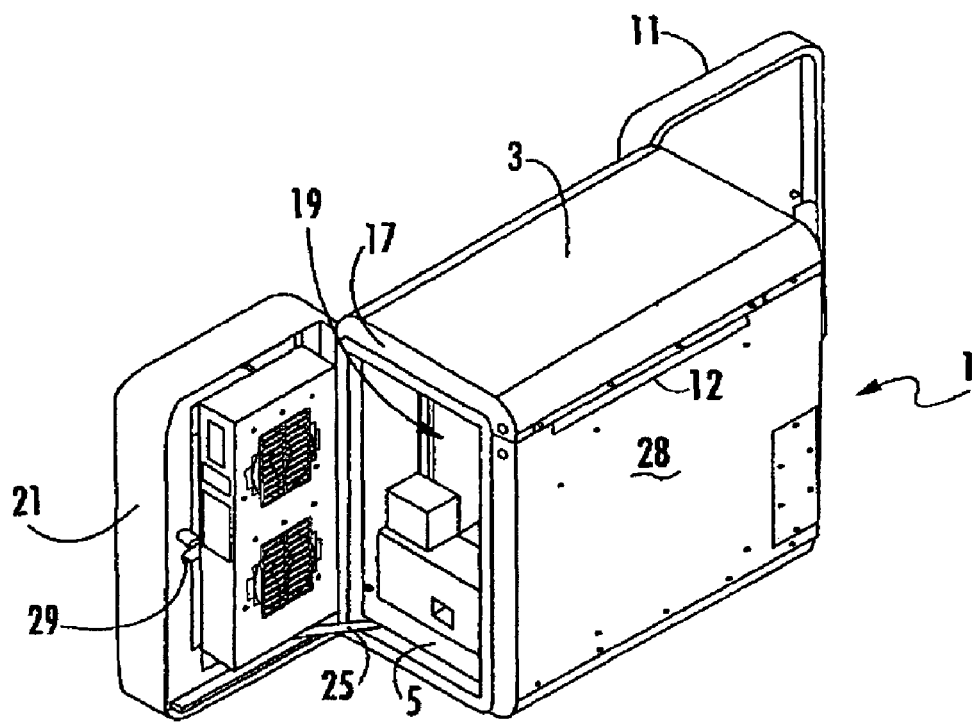
FIG. 3 is a rear perspective view of the outdoor equipment cabinet of FIG. 1 with the front door and the rear door open.

FIG. 1 is front perspective view of an outdoor equipment cabinet 1 in a closed state. FIGS. 2 and 3 are front and rear perspective views of the outdoor equipment cabinet in an open state, respectively. The cabinet 1 includes a housing formed by a plurality of sidewalls, a top panel 3 and a bottom floor 5. Lifting tabs may optionally be provided around a periphery of the top panel 3, so that the cabinet 1 may be hoisted to a desired location using lifting cables.

A first sidewall 7 includes a first opening 9. A front door 11 is attached to the housing and has a first position providing access to the first opening 9 and a second position closing access to the first opening 9. The front door 11 may be attached to the housing by a first hinge 13. A first keeper (not shown), to latch the front door 11 in the first (open) position, may reside between the housing and the front door 11.

A second sidewall 17 includes a second opening 19. A rear door 21 is attached to the housing and has a first position providing access to the second opening 19 and a second position closing access to the second opening 19. The rear door 21 may be attached to the housing by a second hinge 23. A second keeper 25, to latch the rear door 21 in the first (open) position, may reside between the housing and the rear door 21. The first keeper of the front door 11 may be constructed in an identical or similar fashion. One or more gaskets or seals may be attached to the rims of the first and second openings 9 and 19 and/or the rims of the front and rear doors 11 and 21 to seal the first and second doors 11 and 21 to the cabinet 1, while the doors are in the second position.

The front door 11 may include a first latch assembly 27 to hold the front door 11 in the second (closed) position. The first latch assembly 27 may be key-operated to prevent unauthorized access to the interior of the cabinet 1 and/or may include aligned through holes to accept a shackle of a padlock. Likewise, the rear door 21 may include a second latch assembly 29 to hold the rear door 21 in the second (closed) position. The second latch assembly 29 may also be key-operated to prevent unauthorized access to the interior of the cabinet 1 and/or include aligned through holes to accept a shackle of a padlock.

A third sidewall 26 and a fourth sidewall 28 of the housing may be formed as fixed or removable panels. Alternatively, the third and fourth sidewalls 26 and 28 may have additional doors (not illustrated) to provide access to other portions within the cabinet 1. In a preferred embodiment, the third and fourth sidewalls 26 and 28 include brackets 12 to permit the cabinet 1 to be hung on an aerial support attached to a wall or pole.

An equipment compartment 31 resides within the housing. The equipment compartment 31 is accessible via the first opening 9 and/or the second opening 19. The equipment compartment 31 houses pieces of optical and/or electronic equipment 32 (see FIG. 5), which may be sensitive and therefore, should be protected against contamination by water, dust, insects, etc., and which may require maintaining within a prescribed temperature range. Such equipment 32 may include amplifiers, splitters, digital subscriber line access multiplexers (DSLAMs), surge protectors, batteries, etc.

Now, a temperature regulating system, in accordance with one embodiment of the present invention, will be described. A first air vent 41 is located in the cabinet 1. A second air vent 43 is also located in the cabinet 1. As best seen in FIG. 2, preferably the first air vent 41 is an intake air vent and is located in the rear door 21, and the second air vent 43 is an exit air vent and is located in the front door 11.

Figure 4:
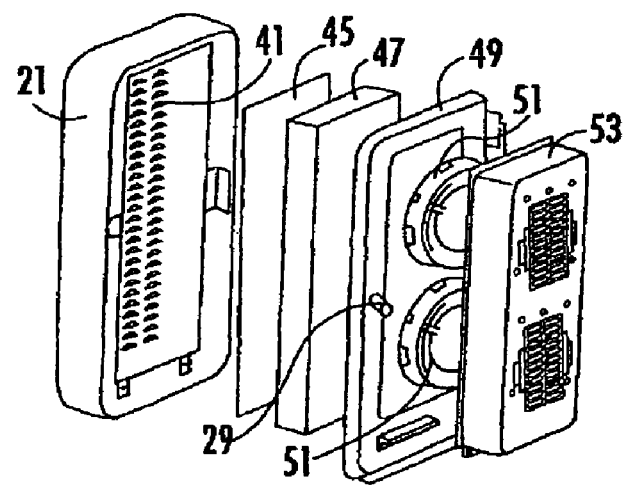
FIG. 4 is an exploded view of the construction of the rear door.

FIG. 4 is an exploded view of the rear door 21 and illustrates several of the temperature regulating component parts mounted within the rear door 21. Downstream of the first air vent 41 resides a screen 45. The screen 45 acts as a barrier to insects and large contaminates. Downstream of the screen 45 resides a filtering membrane 47. The filtering membrane 47 allows air to pass therethrough, but rejects the passage of water and contaminants therethrough (See FIG. 7). Such a filtering membrane 47 is commercially available from W. L. Gore & Associates and is commonly referred to as an ePTFE filter, and marketed under the model numbers of series 2000 and series 3000 filters.

Figure 5:
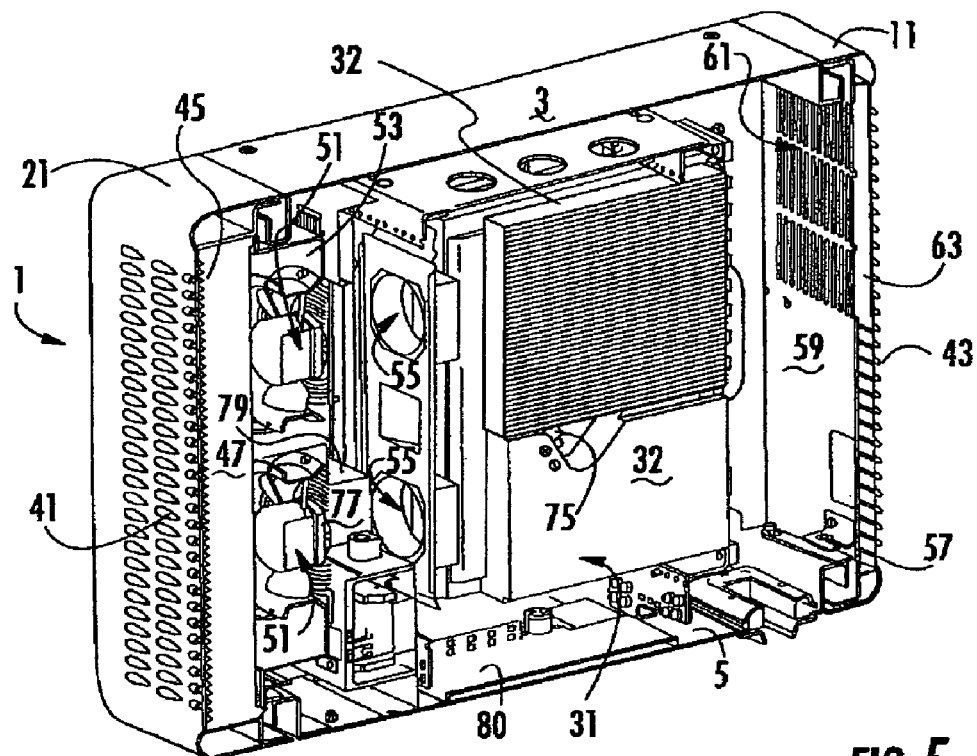
FIG. 5 is a cross sectional view taken along line V-V of FIG. 1.

Downstream from the filtering membrane 47 is a base plate 49. Lastly, a grill plate 53, supporting two fans 51, and is attached to the base plate 49. All of the elements 45, 47, 49, 51 and 53 are preferably attached to the back side of the rear door 21, as best seen in FIG. 3. As best seen in FIG. 5, when the rear door 21 is in the second (closed) position, the fans 51 are aligned with ventilation ports 55 formed within a wall of the equipment compartment 31.

Figure 6:
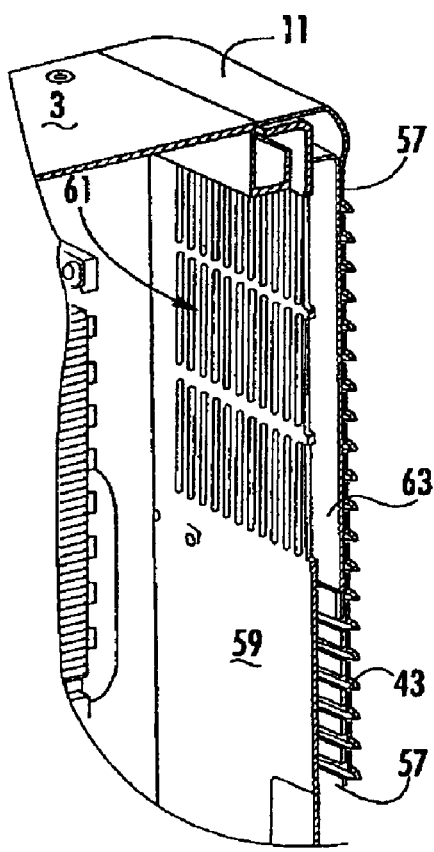
FIG. 6 is a close-up cross sectional view illustrating an air venting pathway within the front door.

FIG. 5 also illustrates a cross sectional view of the front door 11. FIG. 6 is a close up view of the cross section of the front door 11. The front door 11 has a dual wall structure including an exterior wall 57 and an interior wall 59 with an air path formed therebetween within the front door 11, as will be further explained with reference to FIG. 7 below. The exterior wall 57 includes the second air vent 43. An upper half of the interior wall 59 includes a grated opening 61 to allow air to pass therethrough. Adjacent to the grated opening 61 and attached to the exterior wall 57 is a deflector plate 63. The deflector plate 63 resides upstream from, and blocks, an upper half of the second air vent 43 and does not allow air to pass therethrough. The lower half of the second air vent 43 is not blocked by the deflector plate 63 and allows air to pass therethrough.

Figure 7:
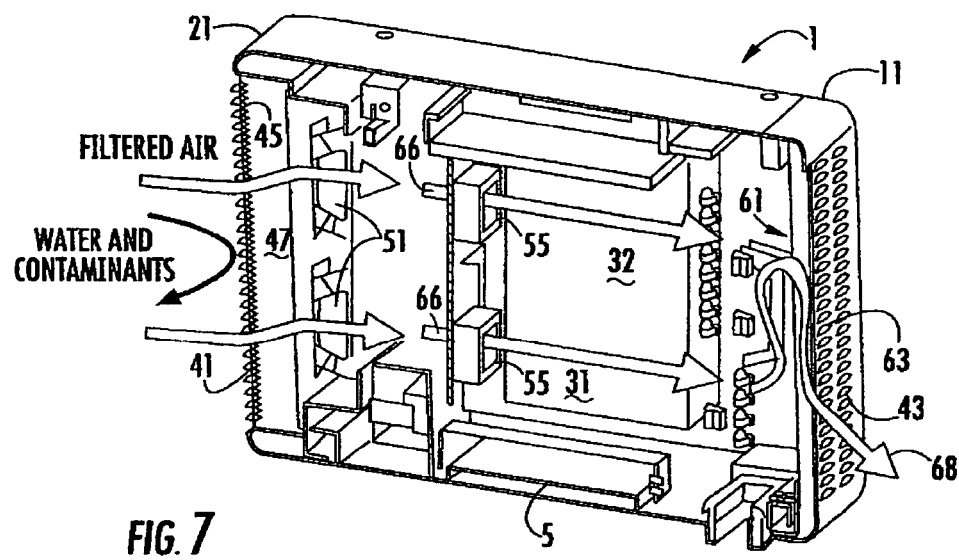
FIG. 7 is a cross sectional view similar to FIG. 5, which illustrates the outside air flow pathway passing through the interior of the cabinet.

Now with reference to FIG. 7, an air flow within the cabinet 1 will be explained. Outside air is drawn into the cabinet 1 by the pulling force of the operating fans 51. The filtering membrane 47 acts to keep water and contaminants from entering the equipment compartment 31. The filtered air stream 66 passes through the ventilation ports 55 and into the equipment compartment 31. To escape the equipment compartment 31, the filtered air stream 66 enters the grated opening 61. The air then impacts the deflector plate 63 and travels downwardly to be pushed out of the lower half of the second air vent 43 as an exiting air flow 68.

The deflector plate 63 serves several functions. First, the exiting air flow 68 is forced to follow a serpentine path through the front door 11. Noise generated by equipment inside of the cabinet 1 is thereby reduced. In other words, there is no straight path into the cabinet through the front door 11 to a source of noise (like the fans 51 or equipment pieces 32). Second, the dual wall structure of the front door 11, with a moving stream of air between the dual walls, greatly reduces any radiant heat transfer from the front door 11 into the equipment compartment 31. Third, it will be very difficult for any wind-driven rain to follow the serpentine pathway backwardly and enter the equipment compartment 31. In other words, the deflector plate 63 stops water from entering the upper half of the second air vent 43 and passing straight through the grated opening 61 and into the equipment compartment 31.

Figure 8:
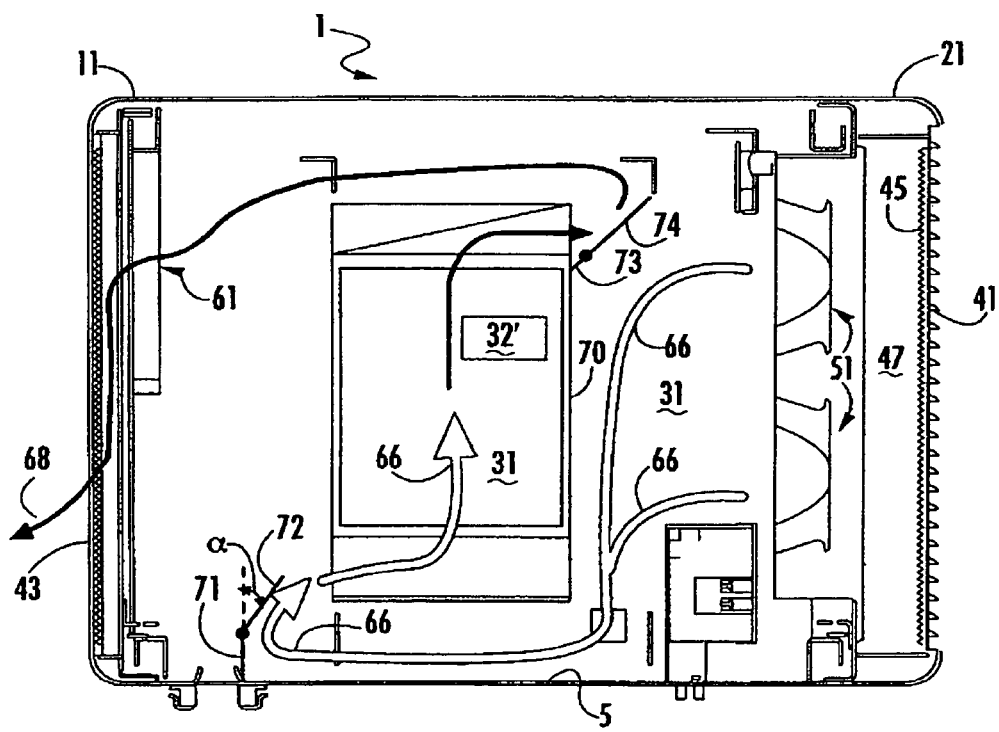
FIG. 8 is a cross sectional view illustrating an alternative embodiment of the outside air flow pathway passing through the interior of the cabinet, in accordance with the present invention.

FIG. 8 illustrates an alternative air flow path within the equipment compartment 31. In FIG. 8, there are no ventilation ports 55, as illustrated in FIGS. 5 and 7. Rather, the filtered air stream 66 encounters a shield 70 and turns downward toward the floor 5 of the cabinet 1. After traveling along the floor 5, the filtered air stream 66 encounters a first baffling plate 72 disposed within the equipment compartment 31. The first baffling plate 72 deflects the filtered air stream 66 and changes its path so as to direct the filtered air stream 66 toward a particular electronic component 32' disposed within the equipment compartment 31.

A second baffling plate 74 may also be included within the equipment compartment 31. The second baffling plate 74 deflects the filtered air stream 66 and changes its path so as to direct the filtered air stream 66 toward the grated opening 61 in the front door 11.

FIG. 8 illustrates the first baffling plate 72 being mounted near a lower end of the equipment compartment 31 and the second baffling plate 74 being mounted near a top end of the equipment compartment 31. However, the baffling plates 72 and 74 may be mounted at other locations. Also, the first and second baffling plates 72 and 74 are attached within the equipment compartment 31 by adjustable mounts 71 and 73, respectively. By this arrangement, a technician may adjust an angle ($\alpha$) of the baffling plates 72 and 74 so as to directed the filtered air stream 66 directly onto components 32' within the equipment compartment 31, which are most in need of cooling.

As best seen in FIG. 5, the temperature regulating system may optionally include a temperature sensor 75 disposed within, or at least proximate, the equipment compartment 31. A controller 77 is in communication with the temperature sensor 75. The controller 77 controls a speed of the fans 51 based upon a temperature as sensed by the temperature sensor 75.

In one embodiment, the controller 77 can place the fans 51 into one of four states including an off state, a low speed state, a medium speed state, and a high speed state dependant upon a sensed temperature. For example, the speeds of the fans 51 may be set to high speed when the sensed temperature exceeds 45 degrees Celsius. The speeds of the fans 51 may be set to medium speed when the sensed temperature is between 25 and 45 degrees Celsius. The speeds of the fans 51 may be set to low speed when the sensed temperature is between 17 and 25 degrees Celsius. The fans 51 may be turned off when the sensed temperature is below 17 degrees Celsius. Further, an optional heating pad 80 may be activated at temperatures below a predetermined threshold temperature, if desired.

One particular advantage of employing a variable speed fan control scheme is that the life span of the filtering membrane 47 is extended. Running a fan at a high speed increases the likelihood of drawing contaminants into the filtering membrane 47. Therefore, a control system that employs a high speed fan operation until the temperature is acceptable, followed by an off state until the temperature is too high again, tends to clog the filtering membrane at a faster rate and increases the servicing costs for the cabinet 1, as compared to the variable speed control system according to this embodiment of the present invention.

Another optional embodiment of the present invention, includes monitoring the current drawn by one or both of the fans 51. A current sensor 79 is disposed inline between the controller 77 and the fans 51. The current sensor 79 measures a current drawn by one or both fans 51 and outputs a signal representing a current drawn value to the controller 77. The controller 77 receives the current drawn value and determines if there is a potential membrane clogged condition dependent upon the current drawn value.

In one embodiment, the controller 77 includes a memory storing predetermined threshold values for maximum current drawn values for respective fan speeds (e.g., low, medium, high). The controller 77 determines if the measured current drawn value exceeds the predetermined threshold value for a present fan speed, and if so the controller 77 initiates a fan testing sequence which includes measuring the current drawn value for the fan 51 at a different fan speed. If the fan 51 fails the fan testing sequences, the controller 77 issues an alarm signal.

In one embodiment, the controller 77 is connected to the communication equipment 32 within the equipment compartment 31. By this arrangement, the alarm signal may be forwarded to a system remotely located from said cabinet 1. For example, if the equipment 32 within the cabinet 1 has Internet connection abilities, the alarm could be issued in the form of an email, indicating a potential membrane clogged condition, sent to a service technician responsible for maintaining the cabinet 1. If the equipment 32 within the cabinet 1 has an interconnection to a cellular or land line telephone network, the alarm could be issued in the form of an automated telephone call to a voicemail service or directly to a service technician responsible for maintaining the cabinet 1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

We claim:

1. An outdoor equipment cabinet comprising:
    a housing;
    a first opening in a first sidewall of said housing;
    a first door attached to said housing having a first position providing access to said first opening and a second position closing access to said first opening;
    an equipment compartment within said housing and being accessible via said first opening;
    an intake air vent formed in said housing;
    an exit air vent formed in said housing;
    a fan mounted within said housing for pulling air into said intake air vent, moving an air stream through said equipment compartment, and pushing air out of said exit air vent;
    a membrane disposed adjacent said intake air vent, wherein said membrane allows air to pass therethrough but resists the passage of water and contaminants therethrough; and
    at least one baffling plate disposed in said equipment compartment for changing a path of the air stream to direct the air stream toward a particular electronic component disposed within said equipment compartment, wherein said at least one baffling plate includes a first baffling plate with an adjustable mount so that an angle of said first baffling plate may be adjusted by a user to redirect the air stream.

2. The cabinet according to claim 1, wherein said at least one baffling plate further includes a second baffling plate so as to change the path of the air stream twice within said equipment compartment.

3. The cabinet according to claim 2, wherein said first baffling plate is mounted near a lower end of said equipment compartment and said second baffling plate is mounted near a top end of said equipment compartment, such that said air flow path follows a serpentine path through said equipment compartment.

4. The cabinet according to claim 1, wherein said intake air vent is formed in said first door.

5. The cabinet according to claim 4, further comprising:
    a second opening in a second sidewall of said housing; and
    a second door attached to said housing having a first position providing access to said second opening and a second position closing access to said second opening.

6. The cabinet according to claim 5, wherein said second sidewall is on an opposite side of said cabinet relative to said first sidewall, and wherein said exit air vent is formed in said second door.

7. An outdoor equipment cabinet comprising:
    a housing;
    a first opening in a first sidewall of said housing;
    a first door attached to said housing having a first position providing access to said first opening and a second position closing access to said first opening;
    an equipment compartment within said housing and being accessible via said first opening;
    an intake air vent formed in said housing;
    an exit air vent formed in said housing;
    a fan mounted within said housing for pulling air into said intake air vent, moving an air stream through said equipment compartment, and pushing air out of said exit air vent;
    a membrane disposed adjacent said intake air vent, wherein said membrane allows air to pass therethrough but resists the passage of water and contaminants therethrough;
    a current sensor disposed to measure a current drawn by said fan and output a signal representing a current drawn value; and
    a controller to received the current drawn value and to determined a potential membrane clogged condition based upon a comparison between the current drawn value and a known current drawn value associated with a clean membrane.

8. The cabinet according to claim 7, further comprising:
    a temperature sensor disposed proximate said equipment compartment, wherein said controller controls a speed of said fan based upon a temperature as sensed by said temperature sensor.

9. The cabinet according to claim 8, wherein said controller can place said fan into an off state and also control the fan speed.

10. The cabinet according to claim 7, wherein said controller includes a memory storing predetermined threshold values for maximum current drawn values for respective fan speeds, wherein the threshold values are established based upon known current drawn values associated with a clean membrane at the respective fan speeds, and wherein said controller determines if the measured current drawn value exceeds the predetermined threshold value for a present fan speed, and if so said controller issues an alarm signal.

11. The cabinet according to claim 10, wherein the alarm signal includes forwarding a message to a system remotely located from said cabinet indicating a potential membrane clogged condition.

12. The cabinet according to claim 7, wherein said controller includes a memory storing predetermined threshold values for maximum current drawn values for respective fan speeds, wherein the threshold values are established based upon known current drawn values associated with a clean membrane at the respective fan speeds, and wherein said controller determines if the measured current drawn value exceeds the predetermined threshold value for a present fan speed, and if so the controller initiates a fan testing sequence which includes measuring the current drawn value for the fan at a different fan speed, and if the fan fails the fan testing sequence, said controller issues an alarm signal.

13. The cabinet according to claim 12, wherein the alarm signal includes forwarding a message to a system remotely located from said cabinet indicating a potential membrane clogged condition.

14. An outdoor equipment cabinet comprising:
a housing;
a first opening in a first sidewall of said housing;
a first door attached to said housing having a first position providing access to said first opening and a second position closing access to said first opening;
an equipment compartment within said housing and being accessible via said first opening;
an intake air vent formed in said housing;
an exit air vent formed in said housing;
a fan mounted within said housing for pulling air into said intake air vent, moving an air stream through said equipment compartment, and pushing air out of said exit air vent;
a membrane disposed adjacent said intake air vent, wherein said membrane allows air to pass therethrough but resists the passage of water and contaminants therethrough;
a second opening in a second sidewall of said housing; and
a second door attached to said housing having a first position providing access to said second opening and a second position closing access to said second opening,
wherein said intake air vent is formed in said first door and said exit air vent is formed in said second door, and
wherein said second door has a dual wall structure including an exterior wall and an interior wall with an air path formed therebetween, and wherein said exit air vent includes a vent pattern passing through said exterior wall of said second door, and further comprising:
an opening formed in said interior wall by which an air stream leaving said equipment compartment enters the air path within said second door.

15. The cabinet according to claim 14, wherein said opening is formed in an upper half of said interior wall of said second door.

16. The cabinet according to claim 14, further comprising:
a plate residing within said second door between said exterior wall and said interior wall, said plate being sized and located so as to shield said opening in said interior wall from said vent pattern in said exterior wall.

17. The cabinet according to claim 14, wherein said second sidewall is on an opposite side of said cabinet relative to said first sidewall.

18. An outdoor equipment cabinet comprising:
a housing;
a first opening in a first sidewall of said housing;
a first door attached to said housing having a first position providing access to said first opening and a second position closing access to said first opening;
an equipment compartment within said housing and being accessible via said first opening;
an intake air vent formed in said housing;
an exit air vent formed in said housing;
a fan mounted within said housing for pulling air into said intake air vent, moving an air stream through said equipment compartment, and pushing air out of said exit air vent;
a membrane disposed adjacent said intake air vent, wherein said membrane allows air to pass therethrough but resists the passage of water and contaminants therethrough;
at least one baffling plate disposed in said equipment compartment for changing a path of the air stream to direct the air stream toward a particular electronic component disposed within said equipment compartment;
a temperature sensor disposed proximate said equipment compartment;
a controller to control a speed of said fan based upon a temperature as sensed by said temperature sensor;
a current sensor disposed to measure a current drawn by said fan and output a signal representing a current drawn value, wherein said controller receives the current drawn value and determines a potential membrane clogged condition based upon a comparison between the current drawn value and a known current drawn value associated with a clean membrane;
a second opening in a second sidewall of said housing; and
a second door attached to said housing having a first position providing access to said second opening and a second position closing access to said second opening,
wherein said intake air vent is formed in said first door and said exit air vent is formed in said second door.

19. The cabinet according to claim 1, further comprising:
a temperature sensor disposed proximate said equipment compartment; and
a controller to control a speed of said fan based upon a temperature as sensed by said temperature sensor.

20. The cabinet according to claim 14, further comprising:
a temperature sensor disposed proximate said equipment compartment; and
a controller to control a speed of said fan based upon a temperature as sensed by said temperature sensor.

* * * * *